United States Patent [19]
Hofer

[11] Patent Number: 5,336,989
[45] Date of Patent: Aug. 9, 1994

[54] AC MAINS TEST APPARATUS AND METHOD

[75] Inventor: Bruce E. Hofer, Portland, Oreg.

[73] Assignee: Audio Presicion, Beaverton, Oreg.

[21] Appl. No.: 762,917

[22] Filed: Sep. 19, 1991

[51] Int. Cl.⁵ .................. G01R 13/20; G01R 15/08
[52] U.S. Cl. .................. 324/115; 324/158.1; 324/73.1; 324/121 R
[58] Field of Search .............. 324/74, 121 R, 130, 324/126, 128, 119, 115, 76.12, 158 R, 73.1; 340/650, 651, 720, 721; 364/480, 483, 487

[56] References Cited

U.S. PATENT DOCUMENTS

| | | | |
|---|---|---|---|
| 3,212,003 | 10/1965 | Barrass et al. | 324/119 |
| 3,725,784 | 4/1973 | Bayer | 324/74 |
| 3,906,344 | 9/1975 | Addis et al. | 324/121 R |
| 4,204,152 | 5/1980 | Imrie | 324/128 |
| 4,585,975 | 4/1986 | Wimmer | 364/487 |
| 4,859,935 | 8/1989 | Smith et al. | 324/115 |

FOREIGN PATENT DOCUMENTS

0430256  6/1991  European Pat. Off. .............. 324/74

Primary Examiner—Vinh Nguyen
Attorney, Agent, or Firm—William A. Birdwell & Associates

[57] ABSTRACT

An ac mains test apparatus and method. An audio frequency signal measurement instrument is provided with a circuit for testing the ac mains to which the instrument is connected. The ac mains is internally connected to a coupler which presents an attenuated portion of the ac mains to the low level input of the instrument. A switch is provided for selectively connecting the input either to an audio signal to be measured or to the ac mains portion. The coupler both attenuates the ac mains for input to the instrument and isolates the relatively high ac mains voltage from the low level input.

12 Claims, 3 Drawing Sheets

AC MAINS TEST APPARATUS AND METHOD

BACKGROUND OF THE INVENTION

This invention relates to audio signal test and measurement apparatuses and methods, and particularly to an audio signal test apparatus and method that permits the measurement of the signal characteristics of the ac mains to which it is connected.

In the measurement of audio signals produced or applied to audio frequency signal processing equipment the signal levels to be measured may cover a wide range, for example, from a few microvolts to one hundred volts. However, most often the signal level is near the low end of that range. Consequently, most audio signal measuring instruments have a high gain input circuit to amplify low level signals to a useful level.

Often, problems in the operation of audio signal processing equipment arise as a consequence of the electrical characteristics of the ac mains supplying that equipment being other than what it should be. (The term "ac mains" is used herein to refer to the ac power source.) Ordinarily, the ac mains in the United States is supposed to provide 120 volts rms, at 60 Hz with very low distortion. In Europe the ac mains voltage is ordinarily 220, 230 or 240 volts rms, depending on the country, and the frequency is ordinarily supposed to be 50 Hz. Audio signal processing equipment is often designed to allow for some variation in the electrical characteristics of the ac mains, for example, by being able to operate normally at 110 volts instead of 120 volts, but abnormal electrical characteristics can still cause problems.

When the ac mains voltage is below normal, modern switching power supplies may quit working, and older power supplies may not supply adequate voltage or current. Distortion in the ac mains can cause over heating of a power supply and also lead to failure of the supply to provide adequate power. While the frequency of most ac mains is generally well regulated, where a significant variation in frequency occurs, a power supply may malfunction. All of these events can lead to malfunctions of audio signal processing equipment.

It would therefore be desirable to include within the same audio frequency measurement instrument that is used to measure the performance of audio signal processing equipment a means for measuring the electrical characteristics of the ac mains which supplies power to that signal processing equipment. However, conventional wisdom militates against measuring the electrical characteristics of the ac mains with the same test instrument used to measure audio signals, because of the need to keep high level 60 or 50 Hz signals away from the sensitive input circuits of such test instruments.

SUMMARY OF THE INVENTION

The aforementioned need to measure the electrical characteristics of the ac mains to which audio signal processing equipment is connected using audio frequency test instrument is met, and the input sensitivity problem associated with doing so is overcome, by the present invention. This is accomplished by selecting an ac mains test instead of an audio signal test and by coupling to the audio signal measurement input of the test instrument an attenuated portion of said ac mains.

The test instrument is preferably provided with a resistor divider network for coupling both sides of the ac mains to a differential low level input of the test instrument. Each side of the network has a large resistor in series with a small resistor, to reduce the voltage provided to the signal measurement input by the ac mains. Preferably, the resistance ratio of the large resistor to the small resistor is on the order of 5,000 to 1. A switch is provided to select between the ac mains and the audio signal to be tested as an input to the test instrument. The ac mains and the large resistors are physically separated a substantial distance from the low level signal input and the small resistors, thereby virtually eliminating any coupling of 60 or 50 Hz ac to the low level input when the ac mains test is not being used. A capacitor is placed across the connections between the large and small resistors to reduce the bandwidth of the ac mains measurement circuit so as to ensure that the measured signal level only reflects 60 or 50 Hz ac mains and its most important harmonics. Alternative coupling means may also be employed.

Accordingly, it is a principal objective of the present invention to provide a new and improved apparatus and method for measuring the electrical characteristics of the ac mains to which a piece of audio signal processing equipment is connected.

It is another objective of the present invention to provide an ac mains measurement function incorporated in a single audio frequency signal test instrument.

It is a further objective of the present invention to provide an ac mains measurement function in an audio frequency test instrument where unwanted coupling of 60 or 50 Hz signals to the low level input of the instrument is avoided.

It is yet another objective of the present invention to provide an ac mains measurement function incorporated in a single audio frequency test instrument which may be switch selected.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
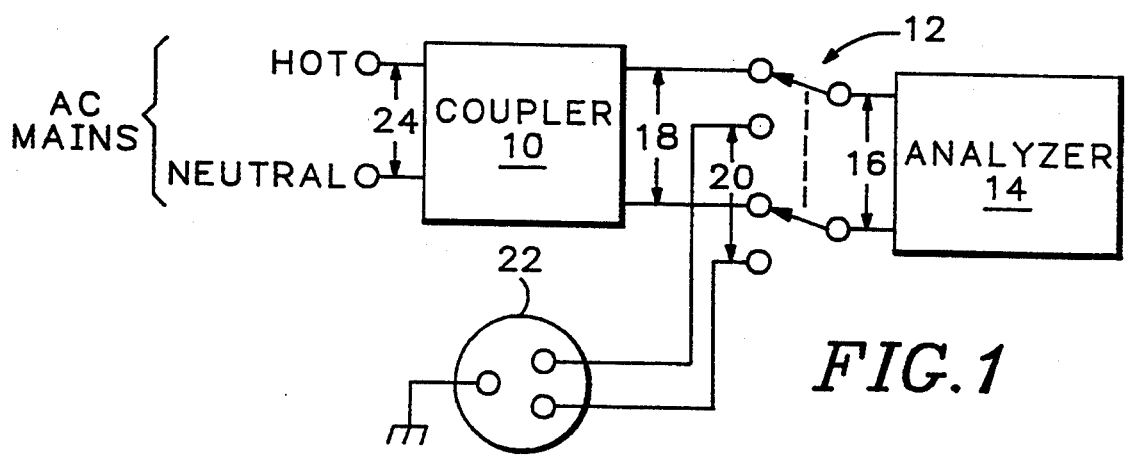
FIG. 1 is block diagram of an ac mains test circuit according to the present invention.

Referring to FIG. 1, the ac mains test circuit of the present invention generally comprises a coupler 10 and a switch 12 incorporated in a test instrument having an analyzer 14. The analyzer, which receives a test signal, amplifies it and determines its electrical characteristics, would ordinarily have a differential, low level input responsive to as little voltage as one microvolt. Preferably, the analyzer enables the test instrument to measure at least the voltage, the distortion and the frequency of a signal applied to its input; in particular, it preferably will measure and display the voltage, harmonic distortion and frequency of the ac mains.

The switch is preferably a double-pole-double-throw switch which can select between a coupler output 18 and a measurement signal input 20. The measurement signal input is ordinarily connected to a three-wire, grounded input jack 22, however other connectors or jacks may be used. The ac mains is connected to an input 24 of the coupler 10, the "hot" wire of the mains being connected to one side of the input 24 and the "neutral" wire being connected to the other side. Ordinarily, the coupler is directly connected to the ac mains input of the test instrument, so that the power plug of the instrument effectively acts as an ac mains test probe.

The coupler 10 is a device for coupling a portion of the ac mains to the low level, sensitive input of the analyzer. As the ac mains has a voltage in the range of 100 to 240 volts rms, depending on the country, it cannot be applied to a high gain amplifier circuit, as would typically be used in an analyzer, without attenuation. The coupler also serves to isolate the voltage ac mains, both physically and electrically, from the low level input of the analyzer so as to eliminate capacitive or inductive coupling of 60 or 50 Hz power line signals to the audio frequency signal measurement input, as is explained below.

Figure 2:
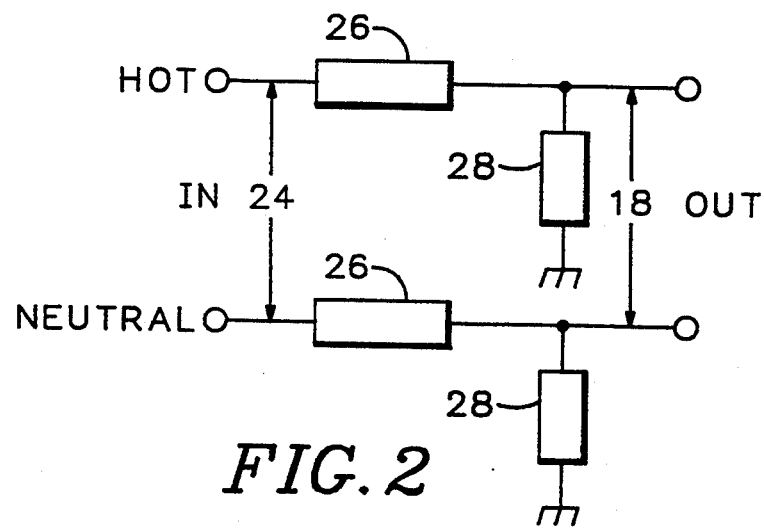
FIG. 2 is a lumped element diagram of one form of ac mains test circuit according to the present invention.

Preferably, the coupler comprises an impedance divider network, as shown in FIG. 2. Each side of the network, that is, the hot side and the neutral side, which correspond to respective sides of the differential input 16 of the analyzer, has a large impedance 26 in series with a small impedance 28. The ratio of the large impedance to the small impedance determines the portion of the ac mains that can be applied to the input of the analyzer 14. Preferably, the ratio is on the order of 5,000 to 1. With that ratio, a nominal 120 volt ac mains would supply 24 millivolts to the input of the analyzer. In addition, the high impedance should be on the order of about 5 Meg ohms to satisfy certain isolation safety standards, and the low impedance should be about as low as 1 Kilo ohms to minimize coupling of audio signals internal to the analyzer onto the attenuated ac mains signal to be measured. However, it should be recognized that other impedance values and ratios could be used without departing from the principles of this invention, and that the high impedance elements and low impedance elements do not necessarily need to be equal.

Figure 3:
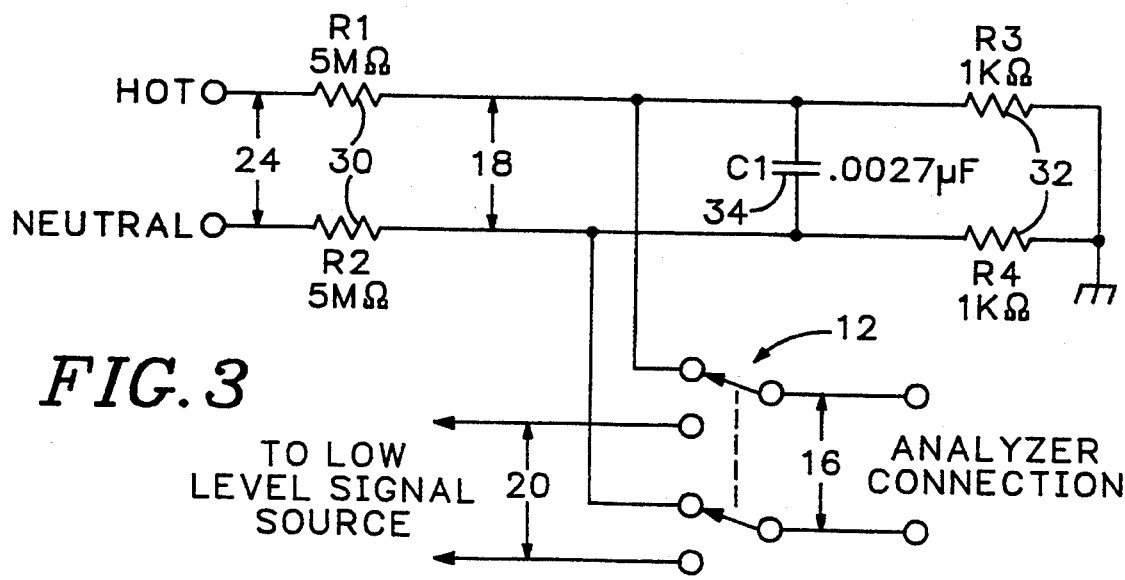
FIG. 3 is a schematic diagram of a preferred embodiment of an ac mains test circuit according to the present invention.

More specifically the impedances preferably are resistors, as shown in FIG. 3. The 5 Meg ohm resistors 30 comprise the respective large impedances, and the 1 Kilo ohm resistors 32 comprise the respective small impedances. The use of resistors for the large and small impedances is desirable because they are easily physically realizable, they can be obtained in very precise tolerances, e.g., 0.1%, they do not introduce phase shift and they are relatively inexpensive.

In addition, the divider network preferably includes a capacitor 34 which keeps the bandwidth within a range that ensures that the voltage level measured by the analyzer is attributable to the ac mains portion and its significant harmonics. It has been found that a bandwidth of about 10 Kilohertz to 50 Kilohertz works well.

Figure 4:
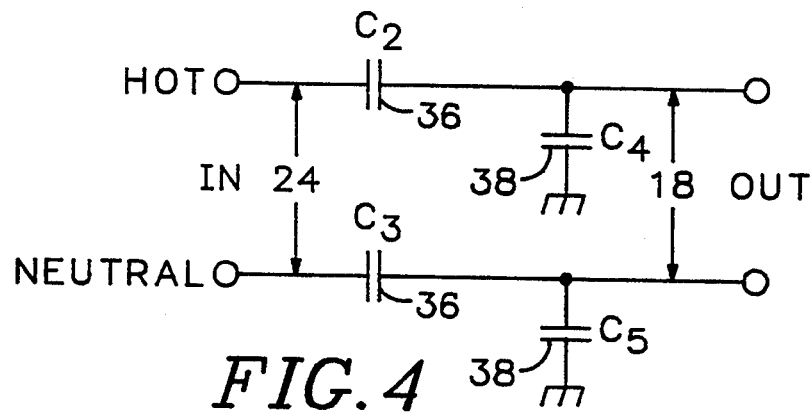
FIG. 4 is a schematic diagram of a first alternative embodiment of an ac mains test circuit according to the present invention.

Turning to FIG. 4, the large impedances and small impedances could also be capacitors 36 and 38, respectively. Their impedance ratios should be the same as for resistors. However, capacitors cannot ordinarily be found with the same value tolerances as resistors, at least near the price of resistors. While capacitors might be hand picked and matched to do the job, that is relatively expensive to do. Moreover capacitors tend to have less favorable temperature coefficients than resistors. Thence, accuracy and cost are problems in the use of capacitors.

Figure 5:
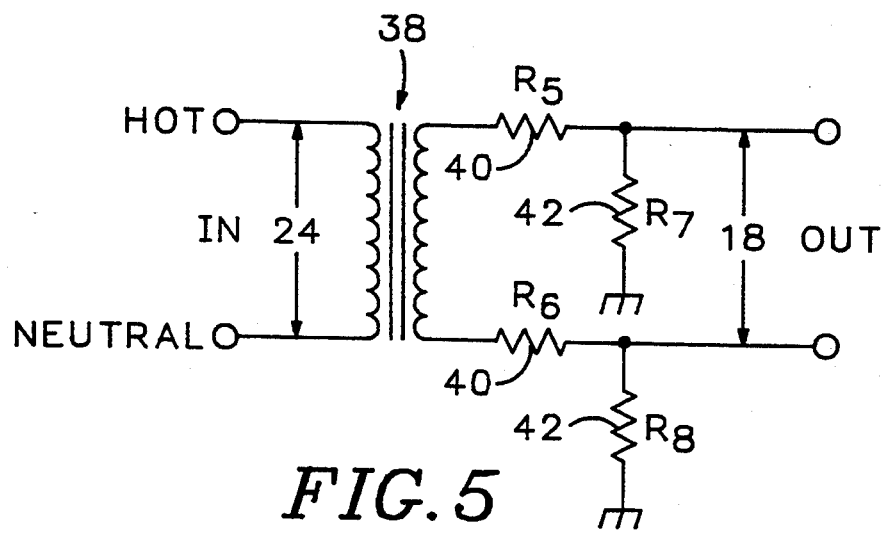
FIG. 5 is a schematic diagram of a second alternative embodiment of an ac mains test circuit according to the present invention.

Other types of couplers may be used as well. For example, the embodiment shown in FIG. 5 employs a transformer 38 to isolate the ac mains from the low level input of the analyzer. The transformer may also be used to attenuate entirely, or partially, the ac mains to the portion to be measured. Where additional attenuation is required, resistors 40 and 42, which are analogous to resistors 30 and 32, respectively, in FIG. 3, may also be used to achieve further attenuation. The principal disadvantage of this embodiment over the preferred embodiment is that the transformer would be relatively expensive. It would also be relatively bulky.

Figure 6:
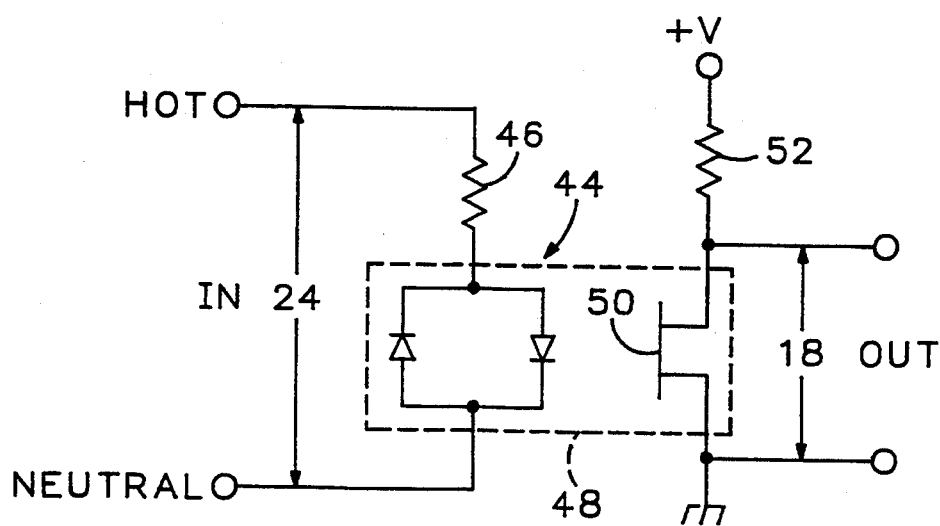
FIG. 6 is a schematic diagram of a third alternative embodiment of an ac mains test circuit according to the present invention.

As another example, optical coupling may be used, as shown in FIG. 6. In this case the ac mains is applied to a bi-directional light emitting diode 44 ("LED") through a limiting resistor 46. As the ac mains voltage varies, the light emitted by the diode varies generally in proportion to the ac mains voltage. The LED, which may be part of a component package 48, is optically coupled to a photodetector, such as field effect device 50 ("FET"), whose resistance varies with the amount of light illuminating it. The FET is connected to a power supply through load resistor 52, so that as the FET resistance varies, the voltage at output 18 also varies. Thence, the output voltage varies generally in proportion to the ac mains input voltage. A disadvantage of this embodiment in comparison to the preferred embodiment is that this embodiment is substantially less accurate.

Figure 7:
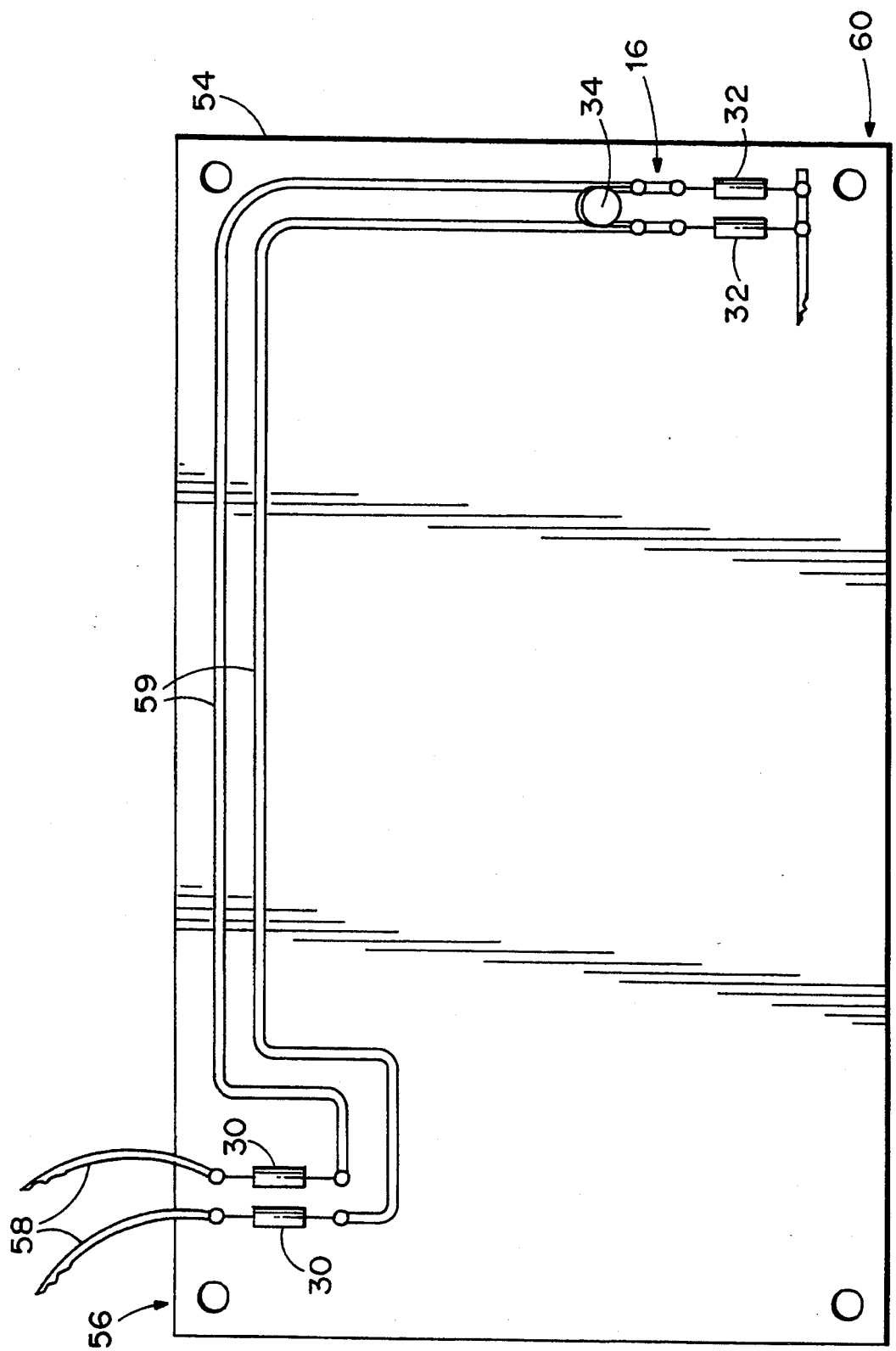
FIG. 7 is a top view of a portion of a representative printed circuit board for use with the present invention.

Turning to FIG. 7, the ac mains test circuit is preferably mounted on a printed circuit board 54 along with other components of the analyzer (not shown). The high impedance elements, i.e., resistors 30, are mounted near corner 56 of the board where the ac mains wires 58 connect to the board. A pair of printed circuit lines 59 run from corner 56 to the corner 60 of the board, the corner farthest away from corner 56, where the low impedance elements, i.e., resistors 32, and the audio signal measurement input 16 are disposed. In this way, the high level ac mains is both physically and electrically isolated from the audio signal measurement input so that there is no significant capacitive or inductive coupling of 60 or 50 Hz ac to the measurement input. In addition, the capacitor 34 is also mounted on the printed circuit board adjacent corner 60.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. In an audio signal measurement instrument having an ac mains power input and a signal measurement input, a test circuit for measuring the electrical characteristics of an ac mains, comprising:
- (a) switch means, having a first input for receiving an audio signal to be measured, a second input connected to said ac mains power input and an output connected to said signal measurement input, for selecting as an input to said signal measurement input either said audio signal to be measured or a signal representative of said ac mains; and
- (b) coupler means, having an input connected to said ac mains power input and an output connected to said second input of said switch means, for coupling to said signal measurement input as said signal representative of said ac mains an attenuated portion of said ac mains.

2. In an audio signal measurement instrument having a signal measurement input, a test circuit for measuring the electrical characteristics of an ac mains, comprising:
- (a) switch means, having a first input for receiving an audio signal to be measured, a second input connected to an ac mains signal and an output connected to said signal measurement input, for selecting as an input to said signal measurement input either said audio signal to be measured at said ac mains signal; and
- (b) an impedance divider network having, for each side of said ac mains, a high impedance and a low impedance, one end of said high impedance being connected to said ac mains, the other end of said high impedance being connected to one end of said low impedance, the other end of said low impedance being connected to ground, and said second input of said switch means being connected to the connection between said high impedance and said low impedance.

3. The test circuit of claim 2, wherein said high impedance comprises a first resistor and said low impedance comprises a second resistor, the ratio of the resistance of said first resistor to the resistance of said second resistor being about 5000 to 1.

4. The test circuit of claim 3, further comprising a capacitor electrically disposed between each side of said impedance divider network and connected between said first resistor and said second resistor of each side of said impedance network for limiting the bandwidth of said test circuit.

5. The test circuit of claim 2, wherein said ac mains connects to said audio signal measurement instrument at a first location and said signal measurement input is disposed at a second location distant from said first location, said high impedance being disposed adjacent said first location and said low impedance being disposed adjacent said second location.

6. The test circuit of claim 2, wherein said high impedance comprises a first capacitor and said low impedance comprises a second capacitor, the ratio of the reactance of said first capacitor to said second capacitor being greater than 1 to 1.

7. A method for measuring the electrical characteristics of an ac mains using an audio signal measurement instrument having an ac mains power input and a signal measurement input, comprising:
- (a) providing within said instrument a selectable signal path from said ac mains power input to said signal measurement input;
- (b) coupling to said signal measurement input over said signal path an attenuated portion of said ac mains;
- (c) selecting as an input to said signal measurement instrument said attenuated portion of said ac mains rather than an audio signal; and
- (d) causing said audio signal measurement instrument to measure an electrical characteristic of said attenuated portion of said ac mains applied to said input of said signal measurement instrument.

8. A method for measuring the electrical characteristics of an ac mains using an audio signal measurement instrument having a signal measurement input, comprising:
- (a) providing within said instrument a selectable signal path from said ac mains to said signal measurement input;
- (b) coupling to said signal measurement input over said signal path a portion of said ac mains using a divider network having, for each side of said ac mains, a high impedance and a low impedance, one end of said high impedance being connected to said ac mains, the other end of said high impedance being connected to one end of said low impedance, the other end of said low impedance being connected to ground, and said signal measurement input being connected to the connection between said high impedance and said low impedance;
- (c) selecting as an input to said signal measurement instrument an ac mains signal rather than an audio signal; and
- (d) causing said audio signal measurement instrument to measure an electrical characteristic of said ac mains signal applied to said input of said signal measurement instrument.

9. The method of claim 8, wherein said high impedance comprises a first resistor and said low impedance comprises a second resistor, the ratio of the resistance of said first resistor to the resistance of said second resistor being greater than 1 to 1.

10. The method of claim 9, wherein a capacitor is connected between said first resistor and said second resistor of each side of said impedance network for limiting the bandwidth of the measurement of said ac mains.

11. The method of claim 8, further comprising the step of separating said ac mains and said high impedance from said signal measurement input and said low impedance.

12. The method of claim 8, wherein said high impedance comprises a first capacitor and said low impedance comprises a second capacitor, the ratio of the reactance of said first capacitor to the reactance of said second capacitor being greater than 1 to 1.

* * * * *

UNITED STATES PATENT AND TRADEMARK OFFICE
CERTIFICATE OF CORRECTION

PATENT NO. : 5,336,989
DATED : August 9, 1994
INVENTOR(S) : Bruce E. Hofer

It is certified that error appears in the above-identified patent and that said Letters Patent is hereby corrected as shown below:

On title page, item [73] change "Audio
   Presicion" as --Audio Precision--.

Column 3, line 1, after "input", insert --16--
   column 3, line 26, before "voltage", insert --relatively high--.

Column 5, claim 2, line 24, "at" should read --or--

Signed and Sealed this

Eighth Day of November, 1994

Attest:

BRUCE LEHMAN

Attesting Officer

Commissioner of Patents and Trademarks